United States Patent [19]

Kawasaki et al.

[11] Patent Number: 5,356,739
[45] Date of Patent: Oct. 18, 1994

[54] STAINPROOF PROTECTOR MADE FROM FLUORINE-CONTAINING ALIPHATIC CYCLIC POLYMER FOR PREVENTING STAINING OF LITHOGRAPHIC MASKS

[75] Inventors: Toru Kawasaki, Ichihara; Masao Unoki, Yokohama; Masaru Nakamura, Tokyo, all of Japan

[73] Assignee: Asahi Glass Company Ltd., Tokyo, Japan

[21] Appl. No.: 7,818

[22] Filed: Jan. 22, 1993

Related U.S. Application Data

[63] Continuation of Ser. No. 531,166, May 31, 1990, abandoned.

[30] Foreign Application Priority Data

May 31, 1989 [JP] Japan .................................. 1-136178

[51] Int. Cl.$^5$ ................................................ G03F 7/11
[52] U.S. Cl. ................................... 430/5; 430/273; 430/302; 430/961; 359/507; 359/511; 359/896; 428/422
[58] Field of Search ................ 430/5, 162, 271, 273, 430/302, 961; 359/507, 511, 896; 428/422

[56] References Cited

U.S. PATENT DOCUMENTS

| | | | |
|---|---|---|---|
| 4,657,805 | 4/1987 | Fukumitsu et al. | 428/215 |
| 5,008,156 | 4/1991 | Hong | 359/507 |
| 5,061,024 | 10/1991 | Keys . | |
| 5,117,272 | 5/1992 | Nomura et al. | 357/52 |

*Primary Examiner*—Charles L. Bowers, Jr.
*Assistant Examiner*—Christopher G. Young
*Attorney, Agent, or Firm*—Oblon, Spivak, McClelland, Maier & Neustadt

[57] ABSTRACT

A stainproof protector for preventing a mask for lithography from staining, which has a protective film made of a polymer having a fluorine-containing aliphatic cyclic structure.

14 Claims, No Drawings

STAINPROOF PROTECTOR MADE FROM FLUORINE-CONTAINING ALIPHATIC CYCLIC POLYMER FOR PREVENTING STAINING OF LITHOGRAPHIC MASKS

This application is a continuation of application Ser. No. 07/531,166, filed on May 31, 1990, now abandoned.

BACKGROUND OF THE INVENTION

1. Field of the Invention

The present invention relates to a stainproof protector for preventing a mask for lithography from staining. More particularly, it relates to a stainproof protector so-called pellicle, which is useful for preventing a photo mask or reticule from deposition of dust during the lithographic process for the production of semiconductors.

2. Discussion of the Background

Lithography is widely used for forming a desired pattern on a substrate in the field of the production of semiconductors. In the production of semiconductors, a reticule or photo mask is used as the mask for lithography. However, if a foreign matter such as dust is deposited on this mask, the shade of this foreign matter is likely to be transferred to the substrate, thus leading to a defective product. Further, when such a mask is to be used again, it is necessary to clean the mask, and the cleaning is likely to bring about defects such as decrease in the image density, disappearance of an image line, falling off of the image line edge, formation of pinholes, etc. Therefore, it is common to employ a stainproof protector having a structure such that a protective film is supported by a ring-shaped frame such as a circular or rectangular frame, to prevent the mask from staining. It is advantageous to use such a stainproof protector not only for protecting the mask from staining but also in that when an enlarged mask such as a reticule is employed, even if some foreign matters are deposited on the protective film, formation of their images on the substrate can be avoided by displacing the position of the protective layer out of the focal length, and thus it is possible to prevent formation of defective products. As the protective film for such a stainproof protector, it has been common to employ a thin film made of nitorcellulose or cellulose acetate. Such a thin film is usually employed in the form of a multi layer film having a so-called reflection preventive coating layer applied in order to obtain a high transmittance for light having a wave length useful for lithography.

However, in order to prepare such a reflection preventive coating film, a relatively expensive production method such as vacuum vapor deposition is required, and there has been a problem that cracking or peeling of the reflection preventive coating film is likely.

Further, Japanese Unexamined Patent Publication No. 83032/1985 proposes to use polymers of fluoroolefins such as tetrafluoroethylene, vinylidene fluoride and hexafluoroethylene for protective films. However, with these polymers, light scattering is likely to take place in a low wavelength region because of their crystallinity, and non-crystalline polymers are poor in creep resistance and have a problem that the protective films are likely to undergo deflection.

Further, in recent years, there has been a trend that for the purpose of improving the degree of integration of semiconductors, light in an ultraviolet region having a short wave length is used in the process of lithography. However, the conventional protective film has a problem that the ultraviolet resistance is poor, and no adequate durability is obtainable in such use.

SUMMARY OF THE INVENTION

The object of the present invention is to overcome the above mentioned drawbacks of the stainproof protectors made of conventional materials and to provide a novel stainproof protector having a protective film excellent in the light transmittance and durability, which has a low refractive index and requires no reflection preventive coating layer, and which is useful for preventing the mask for lithography from staining.

The present inventors have conducted extensive researches with recoginition of the above mentioned problems and as a result, have found that a polymer having a fluorine-containing aliphatic cyclic structure has high transparency and a low refractive index as well as an excellent ultraviolet resistance and is free from light scattering even in a low wavelength region and very advantageous as a material for providing a stainproof protector with a thin film having excellent moldability and sufficient strength and creep resistance.

Thus, the present invention has been accomplished on the basis of the above discovery and provides a stainproof protector for preventing a mask for lithography from staining, which has a protective film made of a polymer having a fluorine-containing aliphatic cyclic structure.

Now, the present invention will be described in detail with reference to the preferred embodiments.

In the present invention, the polymer having a fluorine-containing aliphatic cyclic structure includes a wide range of such polymers including known or well known polymers. Thus, in the present invention, a fluorine-containing polymer having the above specified cyclic structure in its main chain is preferably employed.

For example, those having the following cyclic structures may be mentioned:

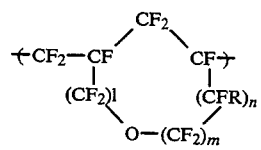

wherein l is from 0 to 5, m is from 0 to 4, n is 0 or 1, provided that l+m+n is from 1 to 6, and R is F or $CF_3$;

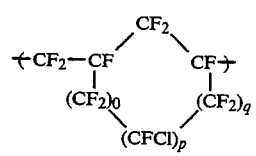

wherein each of o, p and q is from 0 to 5, provided o+p+q is from 1 to 6; and

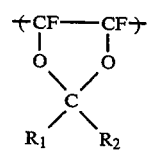

wherein $R_1$ is F or $CF_3$, and $R_2$ is F or $CF_3$. Among these, polymers having the following cyclic structures are representative. However, the present invention is by no means restricted to such specific examples.

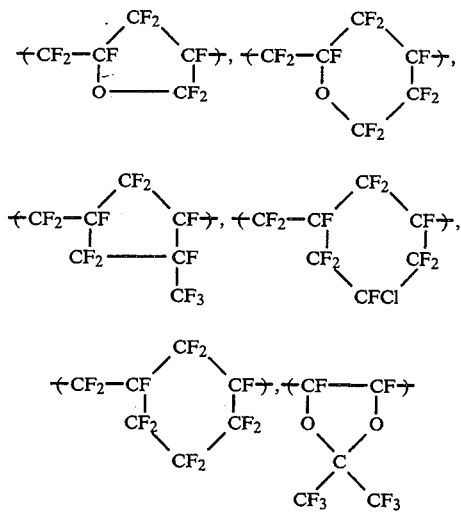

The following two processes may be mentioned for the preparation of these polymers. However, the process is for their preparation are not limited to such specific examples.

1. By cyclic polymerization:

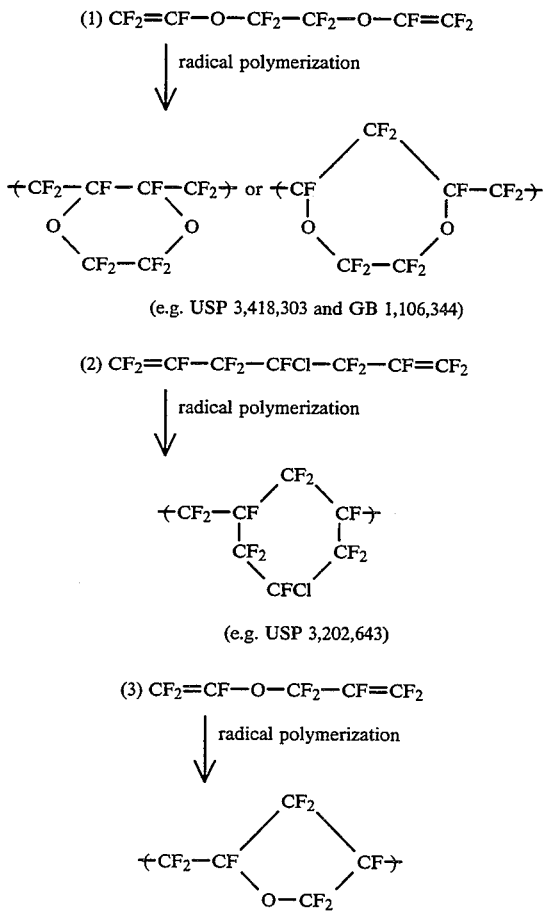

2. By means of a cyclic monomer such as perfluoro-2,2-dimethyl-1,3-dioxol (U.S. Pat. No. 3,978,030 and 4,754,009)

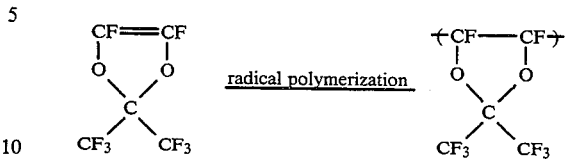

Exemplified above are polymers having a perfluoro aliphatic cyclic structure. However, in the present invention, those having a part of fluorine atoms of the above exemplified polymers substituted by other hydrogen atoms or organic groups, or those having a cyclic structure such as

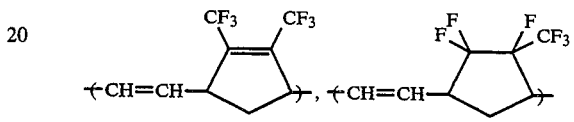

obtainable by metathesis polymerization, may also be employed.

Thus, the polymer having a specific cyclic structure of the present invention can readily and advantageously be obtained by the cyclic polymerization as described above. In particular, by using a monomer which has two polymerizable groups having different polymerizabilities in the molecule and wherein the straight chain portion of the linking chain connecting the two polymerizable groups has from 2 to 7 atoms, the cyclic polymerization can be proceeded smoothly and advantageously while suppressing a side reaction for gelation even without employing super high pressure conditions or highly diluted conditions.

As a monomer suitable for such cyclic polymerization, it is firstly desired that the monomer has two carbon-carbon multiple bonds which are different in the polymerizability. Usually, carbon-carbon double bonds are employed. Two multiple bonds differing in the types or in the structures, are employed. For example, there may be employed a fluorine-containing monomer having two multiple bonds having asymmetrical structures, a monomer having a vinyl group and an allyl group, a monomer having a vinyl ether group and a vinyl group, a monomer having a fluorine-containing multiple bond and a hydrocarbon multiple bond and a monomer having a perfluoro multiple bond and a partially fluorinated multiple bond. Secondly, the straight chain portion of the linking chain connecting such two carbon-carbon multiple bonds, has from 2 to 7 atoms. When the straight chain portion of the linking chain has 0 or one atom, the cyclic polymerization will hardly take place. The same is true also in a case where the straight chain portion has 8 or more atoms. Usually, this number of atoms is preferably from 2 to 5. The linking chain is not limited to a straight chain and may have a side chain structure or a cyclic structure. Further, the constituting atoms are not limited to carbon atoms and may contain hetero atoms such as O, S, N. Thirdly, the fluorine content of the resulting polymer is preferably at least 30% by weight. If the fluorine content is too small, the specificity of fluorine atoms tends to hardly be obtained. Of course, a perfluoro monomer is suitably employed.

The above mentioned specific fluorine-containing monomer includes the following specific monomers:

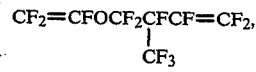

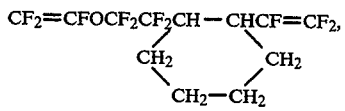

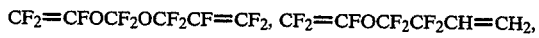

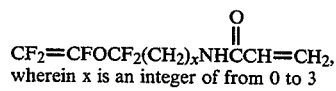

wherein x is an integer of from 0 to 3

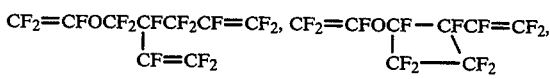

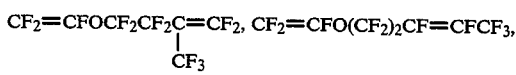

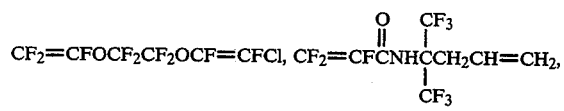

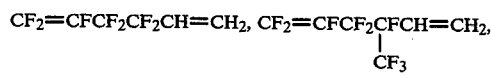

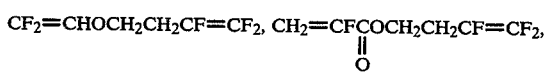

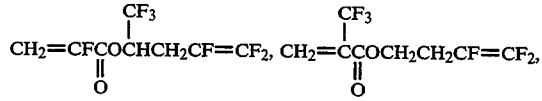

In the present invention, a monomer having one vinyl ether group of $CF_2=CFO-$ is preferably employed from the viewpoint of the polymerization reactivity, the cyclic polymerizability and the suppression of gelation. Particularly, perfluoroallyl vinyl ether ($CF_2=CFOCF_2CF=CF_2$) and perfluorobutenyl vinyl ether ($CF_2=CFOCF_2CF_2CF=CF_2$) may be mentioned as preferred monomers.

The above mentioned monomers may be used alone or in combination as a mixture of two or more. Further, these components may be used and copolymerized with other copolymer components so long as the essential nature thereof will not thereby be impaired. If necessary, the polymer may be cross-linked by some method.

Other monomers to be copolymerized are not particularly limited so long as they are monomers having radical polymerizability, and they cover a wide range of monomers including those of a fluorine-containing type, a hydrocarbon containing type, etc. Of course, these other monomers may be radical-copolymerized alone to the above mentioned monomer capable of introducing the specific cyclic structure, or two or more appropriate types thereof may be used in combination for the above mentioned copolymerization reaction. In the present invention, it is usually preferred to select as such other monomers fluorine-containing monomers such as fluoroolefins or fluorovinyl ethers. For example, tetrafluoroethylene, perfluoromethyl vinyl ether, perfluoropropyl vinyl ether or perfluoro vinyl ether having a functional group such as a carboxylic acid group or a sulfonic acid group, may be mentioned as preferred examples. Further, vinylidene fluoride, vinyl fluoride or chlorotrifluoroethylene may also be mentioned.

As the copolymer composition, in order to obtain the characteristics of the specific fluorine-containing aliphatic cyclic structure for the purpose of the present invention, the composition of the cyclic structure is preferably at least 20 mol %, more preferably at least 40 mol %.

The polymer having the specific cyclic structure of the present invention is soluble in e.g. a fluorine-type solvent, and can be formed into a thin protective film by e.g. cast molding from a solution.

The solvent to be used is not limited so long as it is capable of dissolving the above polymers. However, perfluorobenzene, perfluoro(2-butyltetrahydrofuran), perfluoro(tributylamine), "Afluid" (trade name for a fluorine-type solvent, manufactured by Asahi Glass Company limited), "Fluorinert" (trade name for a liquid containing perfluoro(2-butyltetrahydrofuran), manufactured by 3M Company) and trichlorotrifluoroethane may suitably be employed. Of course, it is possible to use a suitable combination of two or more solvents. In the case of a solvent mixture, a hydrocarbon type, a chlorinated hydrocarbon, a fluorochlorinated hydrocarbon, an alcohol and other organic solvents may be used in combination. The concentration of the solution is usually from 0.01 to 50% by weight, preferably from 0.1 to 20% by weight. As to the method for forming a thin film, there is no particular restriction so long as it is a method for forming a film from a solution, such as a roll coater method, a casting method, a dipping method, a spin coat method, a method for casting on water or a Langmuir Projet method, using the above solution. The obtained thin film may be cross-linked, if necessary, by a method commonly employed. For example, a monomer having a cross-linking site may be copolymerized for cross-linking, a cross--linking agent may be added for cross-linking, or radiation may be employed for crosslinking.

The thickness of the thin film is not particularly limited, but is preferably from 0.5 to 50 μm. To increase the strength of the film and thereby to make it easy to handle it, the thickness of the film is at least 10 μm. Further, by accurately controlling the film thickness, it is possible to increase the transmittance to a level of almost 100% at a certain wave length by utilizing the interference of the reflective light from the front and rear surfaces.

The protective film in the present invention may be composed solely of the polymer having a fluorinecontaining aliphatic cyclic structure, or may be the one obtained by laminating the polymer having a fluorine-containing aliphatic cyclic structure with other transparent synthetic resin. Otherwise, a transparent conductive layer may be formed on a layer of the polymer of a fluorine-containing aliphatic cyclic structure. The lamination with other transparent synthetic resin may be accomplished by a method which comprises coating the polymer having a fluorine-containing aliphatic cyclic structure on a film of the transparent synthetic resin.

The formation of the transparent conductive layer may be conducted by vacuum deposition or spattering of the transparent conductive material on a film of the polymer having a fluorine-containing aliphatic cyclic structure.

In the stainproof protector of the present invention, the above described protective film is supported by a ring-shaped frame. The ring-shaped frame may be of a circular-shape or of a polygonal shape such as tetragonal shape. Such a shape can optionally be determined depending upon the particular purpose. The ring-shaped frame preferably has a certain height so that the protective film and the mask for lithography is separated at a proper distance. Such a height is determined depending upon the lithographic apparatus, but is usually within a range of from 3 to 7 mm. There is no particular restriction as to the material of such a frame, and various materials such as metals or resins may be used for such a frame. The protective film may be supported by a usual supporting method such as by adhesion by means of an adhesive.

In many cases, the stainproof protector of the present invention is used as fixed to the mask such as a photo mask or a reticule. Such fixing can readily be made by providing an adhesive layer to the lower surface of the frame of the stainproof protector, so that the adhesive layer is fixed to the mask for lithography.

In the present invention, the polymer having a fluorine-containing aliphatic cyclic structure has a little or no substantial crystallinity. Therefore, despite the fact that it is a fluorine resin, it has high transparency and high light transmittance. Further, since it is a fluorine-containing polymer, it is excellent in the light resistance and shows particularly high ultraviolet resistance, whereby it exhibits excellent durability in use for the lithographic process, and it is superior to usual hydrocarbon resins in the moisture resistance, weather resistance and chemical resistance. However, it should be understood that such a description is intended to help understand the present invention and by no means restrict the present invention.

Now, the present invention will be described in further detail with reference to Examples. However, it should be understood that the present invention is by no means restricted by such specific Examples.

PREPARATION EXAMPLE 1

35 g of perfluoroallyl vinyl ether, 5 g of trichlorotrifluoroethane (hereinafter referred to simply as R-113), 150 g of deionized water and 35 mg of

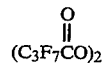

as a polymerization initiator, were introduced into a pressure resistant glass autoclave having an internal capacity of 200 ml. The interior of the system was flushed three times with nitrogen, and then suspension polymerization was conducted at 26° C. for 23 hours, to obtain 28 g of a polymer.

The infrared absorption spectrum of this polymer was measured, whereby no absorption was observed at about 1,790 cm$^{-1}$ and 1,840 cm$^{-1}$ attributable to a double bond as observed with the monomer. This polymer was dissolved in perfluorobenzene, and the $^{19}$F NMR spectrum was measured to obtain a spectrum showing the following repeating structure:

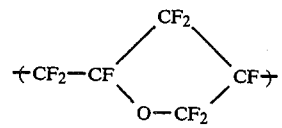

The specific viscosity [$\eta$] of this polymer was 0.530 as measured at 30° C. in "Fluorinert" FC-75 (trade name for a liquid containing perfluoro(2-butyltetrahydrofuran) as the main component, manufactured by 3M Company, hereinafter referred to simply as FC-75). The glass transition temperature of the polymer was 69° C., and it was a glass-like polymer which was tough and transparent at room temperature. Its 10% heat decomposition temperature was 462° C. The refractive index was as low as 1.34.

PREPARATION EXAMPLE 2

20 g of 1,1,2,4,4,5,5-heptafluoro-3-oxa-1,6-heptadiene and 40 g of R-113 were introduced into a three-necked flask flushed with nitrogen, and 20 mg of

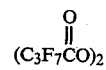

was added thereto as a polymerization initiator. The interior of the system was flushed with nitrogen, and the polymerization was conducted at 18° C. for 10 hours, to obtain 10 g of a polymer. This polymer was a polymer soluble in R-113, and the specific viscosity [$\eta$] was 0.96 as measured at 30° C. in m-xylenehexafluoride. By the $^{19}$F and $^1$H NMR, it was confirmed to be a polymer having a cyclic structure on its backbone chain. This polymer was colorless and transparent and the refractive index was as low as 1.36.

PREPARATION EXAMPLE 3

35 g of perfluorobutenyl vinyl ether, 5 g of R-113, 150 g of deionized water and 50 mg of diisopropyl peroxydicarbonate as a polymerization initiator were introduced into a pressure resistant glass autoclave having an internal capacity of 200 ml. The interior of the system was flushed three times with nitrogen, and then suspension polymerization was conducted at 40° C. for 23 hours, to obtain 28 g of a polymer.

The specific viscosity [$\eta$] of this polymer was 0.50 as measured at 30° C. in "Fluorinert" FC-75. The glass transition temperature of this polymer was 108° C, and it was a glass-like polymer which was tough and transparent at room temperature. It was confirmed to be a polymer having a cyclic structure from the $^{19}$F NMR spectrum. Its 10% heat decomposition temperature was 466° C. The refractive index was as low as 1.34.

EXAMPLES 1 TO 3

Each of the polymers obtained in Preparation Examples 1 to 3, was dissolved in Fluorinert FC43 (trade name, manufactured by 3M Company) to obtain a 5.0-10.0 wt % solution. Then, using such a solution, a cast film was formed on a glass plate by spin coating, and it was peeled off from the glass plate in water. In this manner, thin films having a thickness of 0.8 $\mu$m, 2 $\mu$m, 5 $\mu$m and 10 $\mu$m were prepared, respectively.

The light transmittance of each thin film was measured. In each case, the transmittance was at least 92% throughout a wave length region of from 250 to 700 nm.

Using the thin film having a thickness of 0.8 μm made of the polymer obtained in Preparation Examples 1 and 2, the transmittance of i-ray (365 nm) and g-ray (436 nm) used for photo lithography was measured, whereby a transmittance as high as at least 95% was obtained.

Further, these films were subjected to ultraviolet irradiation tests, whereby each film showed excellent durability, thus indicating that each film is useful as a protective film for a stainproof protector.

EXAMPLE 4

The thin film-forming and the test were conducted in the same manner as in Example 1 except that a 5.0 wt % solution obtained by dissolving in perfluoro (tributylamine), a fluorine-containing copolymer comprising 26 mol % of tetrafluoroethylene and 74 mol % of perfluoro-2,2-dimethyl-1,3-dioxasol, instead of the polymer obtained in the preparation Example, was used. Good results were obtained with respect to each of the transmittance and the ultraviolet durability.

The present invention provides an excellent effect that by using a polymer having a fluorine-containing aliphatic cyclic structure as the material for a protective film, it is possible to obtain a protector for the mask for lithography such as a photo mask or reticule from staining, which has a low refractive index, high light transmittance and light resistance, particularly high ultraviolet resistance and which thus exhibit excellent durability for use in a lithographic process. Especially the one having a high fluorine content, also has high heat resistance, chemical resistance and moisture resistance.

What is claimed is:

1. A stainproof protector for preventing a mask for lithography from staining, which has a protective film made of a polymer having a fluorine-containing aliphatic cyclic structure.

2. The stainproof protector according to claim 1, wherein the polymer is a polymer having the cyclic structure in its main chain, obtained by cyclic polymerization.

3. The stainproof protector according to claim 1, wherein the polymer is a polymer having the cyclic structure in its main chain, obtained by cyclic polymerization of a monomer having two carbon-carbon multiple bonds differing in the polymerizability in its molecule.

4. The stainproof protector according to claim 3, wherein the monomer is the one wherein the straight chain portion of the linking chain connecting the two carbon-carbon multiple bonds has from 2 to 7 atoms.

5. The stainproof protector according to claim 1, wherein the polymer is a polymer having the cyclic structure in its main chain, obtained by cyclic polymerization of at least one monomer selected from the group consisting of a perfluoroallyl vinyl ether and a perfluorobutenyl vinyl ether.

6. The stainproof protector according to claim 1, wherein the polymer is a polymer having the cyclic structure in its main chain, obtained by radical polymerization of a cyclic monomer.

7. The stainproof protector according to claim 1, wherein the polymer is a polymer having the cyclic structure in its main chain, obtained by radical polymerization of perfluoro-2,2-dimethyl-1,3-dioxol.

8. The stainproof protector according to claim 1, wherein the polymer is a polymer having a fluorine content of at least 30% by weight.

9. The stainproof protector according to claim 1, wherein the polymer is a polymer containing at least 20 mol % of the cyclic structure.

10. The stainproof protector according to claim 1, wherein the mask is a photo mask.

11. The stainproof protector according to claim 1, wherein the mask is a reticule.

12. The stainproof protector according to claim 1, which comprises a ring-shaped frame and the protective film.

13. The stainproof protector according to claim 12, wherein the protective film is supported by the ring-shaped frame.

14. The stainproof protector according to claim 1, wherein the protective film is a laminate of a transparent synthetic resin and the polymer having a fluorine-containing aliphatic cyclic structure.

* * * * *